(12) United States Patent
Yamamoto et al.

(10) Patent No.: US 8,084,338 B2
(45) Date of Patent: Dec. 27, 2011

(54) SEMICONDUCTOR DEVICE AND MANUFACTURING METHOD THEREOF

(75) Inventors: Tomonari Yamamoto, Kawasaki (JP); Kenichi Okabe, Kawasaki (JP)

(73) Assignee: Fujitsu Semiconductor Limited, Yokohama (JP)

( * ) Notice: Subject to any disclaimer, the term of this patent is extended or adjusted under 35 U.S.C. 154(b) by 437 days.

(21) Appl. No.: 11/155,668

(22) Filed: Jun. 20, 2005

(65) Prior Publication Data
US 2005/0233558 A1    Oct. 20, 2005

Related U.S. Application Data

(63) Continuation of application No. PCT/JP03/07848, filed on Jun. 20, 2003.

(51) Int. Cl.
*H01L 21/04* (2006.01)
(52) U.S. Cl. ........................ 438/510; 438/795
(58) Field of Classification Search .................. 438/510, 438/542, 795
See application file for complete search history.

(56) References Cited

U.S. PATENT DOCUMENTS

| | | | |
|---|---|---|---|
| 5,663,077 A * | 9/1997 | Adachi et al. | 438/151 |
| 5,915,196 A * | 6/1999 | Mineji | 438/526 |
| 5,966,605 A | 10/1999 | Ishida | |
| 6,214,681 B1 * | 4/2001 | Yu | 438/300 |
| 6,689,671 B1 * | 2/2004 | Yu et al. | 438/486 |
| 6,777,317 B2 | 8/2004 | Seibeel et al. | |
| 6,936,505 B2 * | 8/2005 | Keys et al. | 438/166 |
| 2001/0011756 A1 * | 8/2001 | Yu | 257/408 |
| 2001/0034095 A1 | 10/2001 | Matsuda | |
| 2002/0121654 A1 * | 9/2002 | Yamamoto | 257/288 |
| 2003/0045074 A1 | 3/2003 | Seibel et al. | |
| 2003/0199145 A1 * | 10/2003 | Noguchi | 438/291 |
| 2006/0030109 A1 * | 2/2006 | Ranade et al. | 438/283 |

FOREIGN PATENT DOCUMENTS

| | | |
|---|---|---|
| JP | 5-152227 | 6/1993 |
| JP | 7-263678 A | 10/1995 |
| JP | 8-148680 | 6/1996 |
| JP | 9-135025 A | 5/1997 |
| JP | 2001-196469 A | 7/2001 |
| JP | 2003-60064 | 2/2003 |
| WO | WO 03/021640 A2 | 3/2003 |

OTHER PUBLICATIONS

Patent Abstracts of Japan, Publication No. 2002329864 A, published on Nov. 15, 2002.
Japanese Office Action mailed Sep. 1, 2009, issued in corresponding Japanese Application No. 2005-500909.
Japanese Office Action dated Mar. 17, 2009; issued in corresponding Japanese Application No. 2005-500909.

* cited by examiner

*Primary Examiner* — Bradley K Smith
(74) *Attorney, Agent, or Firm* — Westerman, Hattori, Daniels & Adrian, LLP

(57) ABSTRACT

The depletion of a gate electrode (103) is suppressed in such a way that impurities are introduced into the gate electrode that is formed on a semiconductor substrate (101), with a gate insulating film (102) interposed between the gate electrode (103) and the semiconductor substrate (101), and that, by irradiating a laser beam onto the gate electrode (103), the introduced impurities are made to diffuse up to the interface between the gate electrode (103) and the gate insulating film (102).

4 Claims, 15 Drawing Sheets

SEMICONDUCTOR DEVICE AND MANUFACTURING METHOD THEREOF

This application is a continuation of international application PCT/JP2003/007848 filed on Jun. 20, 2003.

TECHNICAL FIELD

The present invention relates to semiconductor devices and manufacturing methods thereof, and particularly to annealing of impurities ion-implanted in semiconductor layers.

BACKGROUND ART

Conventionally, lamp annealing is included in the annealing methods that are implemented in order to activate impurities ion-implanted in a semiconductor layer and to enable a semiconductor crystal to recover from damage. The lamp annealing is to form an impurity-diffused layer in a semiconductor layer to be treated, by activating, in the presence of nitrogen ($N_2$), impurities in the semiconductor layer through heat treatment with an infrared lamp. For example, in the case of MOS transistor, the lamp annealing has been utilized as a method of heat treatment for impurities implanted in order to reduce parasitic resistance in a gate electrode and source/drain regions, and the like.

In addition, recently, as the annealing for impurities ion-implanted in order to form source/drain regions, laser annealing through laser-beam irradiation has been expected. The laser annealing is heat treatment to heat up a local region in an extremely short time to implement fusion/recrystallization and has advantages in that high electric activation beyond a solid solubility limit, of impurities in a semiconductor, which is ordinarily limited by temperature, can be obtained and that a steep impurity profile can be obtained.

Patent Literature 1

Japanese Patent Application Laid-Open No. 2002-329864

However, in conventional annealing, impurities ion-implanted in a semiconductor layer diffuse outward, whereby the absolute amount of the impurities decreases; in consequence, there are problems in that, in a gate electrode, its depletion is caused, and that, in source/drain regions, the increase of parasitic resistance is caused.

The present invention has been implemented in consideration of the foregoing problems; it is an object of the present invention to realize semiconductor devices that prevent the impurities from diffusing outward and manufacturing method thereof.

SUMMARY OF THE INVENTION

A method of manufacturing a semiconductor device, according to the present invention, comprises steps of:
forming on a semiconductor substrate a gate insulating film; forming on the gate insulating film a semiconductor film that is supposed to become a gate electrode;
introducing impurities into the semiconductor film; and diffusing the impurities up to the interface between the semiconductor film and the gate insulating film, by irradiating a laser beam onto the semiconductor film.

Moreover, another aspect of a method of manufacturing a semiconductor device, according to the present invention, further comprises forming source/drain regions, by introducing impurities into the surface of the semiconductor substrate on both sides of the gate electrode, and by diffusing through lamp annealing the impurities; and wherein the lamp annealing is implemented in the presence of oxygen in the atmosphere.

Still moreover, further another aspect of a method of manufacturing a semiconductor device, according to the present invention, comprises steps of:
patterning and forming on a semiconductor substrate a gate electrode by way of a gate insulating film;
forming on the semiconductor substrate on both sides of the gate electrode a pair of semiconductor layers;
introducing impurities into the surfaces of the semiconductor layers; and
forming source/drain regions, by irradiating a laser beam onto the semiconductor layers, and by diffusing the impurities in such a way as to penetrate under the gate electrode of the semiconductor substrate.

Furthermore, in further another aspect of a method of manufacturing a semiconductor device, according to the present invention, the semiconductor substrate and the semiconductor layers are formed of a single crystalline semiconductor; and the aspect further comprises amorphizing preliminarily the single crystalline semiconductor in source/drain forming regions into an amorphous semiconductor, by introducing into the surfaces of the semiconductor layers, in directions oblique to the surface, atoms having nature to the extent of being enough to amorphize the single crystalline semiconductor, before or after introducing impurities into the surface layers of the semiconductor layers.

Still furthermore, further another aspect of a method of manufacturing a semiconductor device, according to the present invention, comprises steps of:
forming, by way of a gate insulating film, on a semiconductor substrate a semiconductor film that is supposed to become a gate electrode;
introducing impurities into the semiconductor film;
diffusing the impurities up to the interface between the semiconductor film and the gate insulating film, by irradiating a laser beam onto the semiconductor film;
forming a pair of semiconductor layers on the semiconductor substrate on both sides of the gate electrode that is made by patterning and forming the semiconductor film;
introducing impurities into the surfaces of the semiconductor layers; and
forming source/drain regions, by irradiating a laser beam onto the semiconductor layers, and by diffusing the impurities that have been introduced into the semiconductor layers, in such a way as to penetrate under the gate electrode in the semiconductor substrate.

Still furthermore, further another aspect of a method of manufacturing a semiconductor device, according to the present invention, comprises steps of:
forming, by way of a gate insulating film, on a semiconductor substrate a semiconductor film that is supposed to become a gate electrode;
introducing impurities into the semiconductor film;
forming a pair of semiconductor layers on the semiconductor substrate on both sides of the gate electrode that is made by patterning and forming the semiconductor film;
introducing impurities into the surfaces of the semiconductor layers; and
diffusing the impurities that have been introduced into the gate electrode up to the interface between the gate electrode and the gate insulating film, by irradiating a laser beam onto the gate electrode and the semiconductor layers, and forming source/drain regions, by diffusing the impurities that have been introduced into the semiconductor layers, in such a way as to penetrate under the gate electrode in the semiconductor substrate.

A semiconductor device according to the present invention comprises a semiconductor substrate, a gate insulating film formed on the semiconductor substrate, and a gate electrode made of a semiconductor that is patterned and formed on the gate insulating film, and in the gate electrode, the impurities that have been introduced, through laser annealing, up to the interface between the gate electrode and the gate insulating film are diffused.

Another aspect of a semiconductor device according to the present invention comprises a semiconductor substrate, a gate insulating film formed on the semiconductor substrate, a gate electrode made of a semiconductor that is patterned and formed on the gate insulating film, and source/drain regions formed by diffusing through laser annealing the impurities that have been introduced into the surfaces of the semiconductor layers, in such a way as to penetrate under the gate electrode in the semiconductor substrate.

BRIEF DESCRIPTION OF THE DRAWINGS

FIG. 4D, are schematic cross-sectional views illustrating in order of process the method of manufacturing the CMOS-type transistor according to Embodiment 1;

FIG. 5D, are schematic cross-sectional views illustrating in order of process the method of manufacturing the CMOS-type transistor according to Embodiment 1;

FIG. 6D, is a schematic cross-sectional view illustrating in order of process the method of manufacturing the CMOS-type transistor according to Embodiment 1;

FIG. 9D, are schematic cross-sectional views illustrating in order of process the method of manufacturing the CMOS-type transistor according to a variant example of Embodiment 1;

FIG. 10D, are schematic cross-sectional views illustrating in order of process the method of manufacturing the CMOS-type transistor according to a variant example of Embodiment 1;

FIG. 12D, are schematic cross-sectional views illustrating in order of process the method of manufacturing the CMOS-type transistor according to Embodiment 2;

FIG. 13D, are schematic cross-sectional views illustrating in order of process the method of manufacturing the CMOS-type transistor according to Embodiment 2.

DETAILED DESCRIPTION OF THE PREFERRED EMBODIMENTS

Fundamental Outline of the Present Invention

By focusing attention on the fact that the problem of outward impurity diffusion in conventional annealing causes the depletion of a gate and the increase of parasitic resistance in source/drain regions, the inventor of the present invention has conceived the following outline of the present invention:

In the first place, in order to activate impurities and to make a semiconductor crystal recover from damage, the inventor considered suppressing the foregoing depletion of a gate and the increase of parasitic resistance in source/drain regions, due to outward impurity diffusion described above, by utilizing conventional laser annealing through laser-beam irradiation.

The depletion of gate electrode has become a conspicuous problem in recent progress in miniaturizing semiconductor devices; while the thickness of a gate insulating film becomes thinner due to the miniaturization of a semiconductor device, the effect of the depletion layer in a gate electrode becomes larger, thereby thickening the effective gate insulating film including the depletion layer. With increased thickness of the effective gate insulating film, the driving current decreases.

Figure 1A:
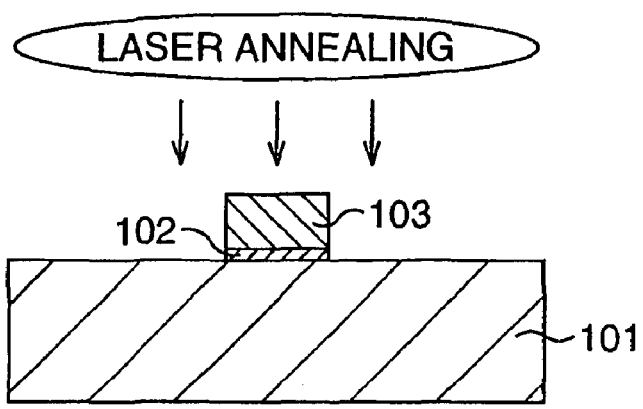
FIGS. 1A and 1B are schematic cross-sectional views of a semiconductor device, for explaining the fundamental outline of the present invention.

In this situation, with regard to the depletion of a gate electrode, as illustrated in FIG. 1A, the inventor implements laser annealing on a semiconductor film to become a gate electrode 103, thereby fusing the entire semiconductor film, and thereby making impurities diffuse in the entire region of the gate electrode 103. In other words, by implementing impurity diffusion down to the interface between the gate electrode 103 and a gate insulating film 102, the effective gate insulating film is prevented from thickening, whereby the depletion of the gate electrode is suppressed.

Figure 1B:
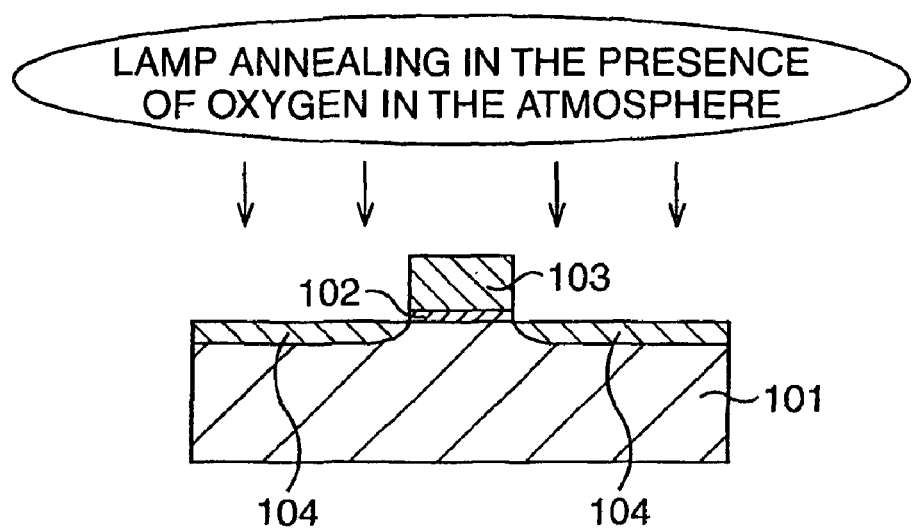

In addition, in a manufacturing process of MOS transistor, when, after the formation of the gate electrode 103, source/drain regions 104 is formed, by activating, through lamp annealing, impurities ion-implanted in the surface layer of a semiconductor substrate 101, with the gate electrode 103 as a mask, impurities diffused in the entire region of the gate electrode 103, in the process illustrated in FIG. 1A, diffuse outward, and the density of impurities is eventually lowered, if the lamp annealing processing is implemented through conventional lamp annealing. In this regard, in the present invention, as illustrated in FIG. 1B, by implementing lamp annealing in the presence of oxygen ($O_2$), the outward diffusion of the impurities diffused in the gate electrode 103 is prevented.

Figure 2:
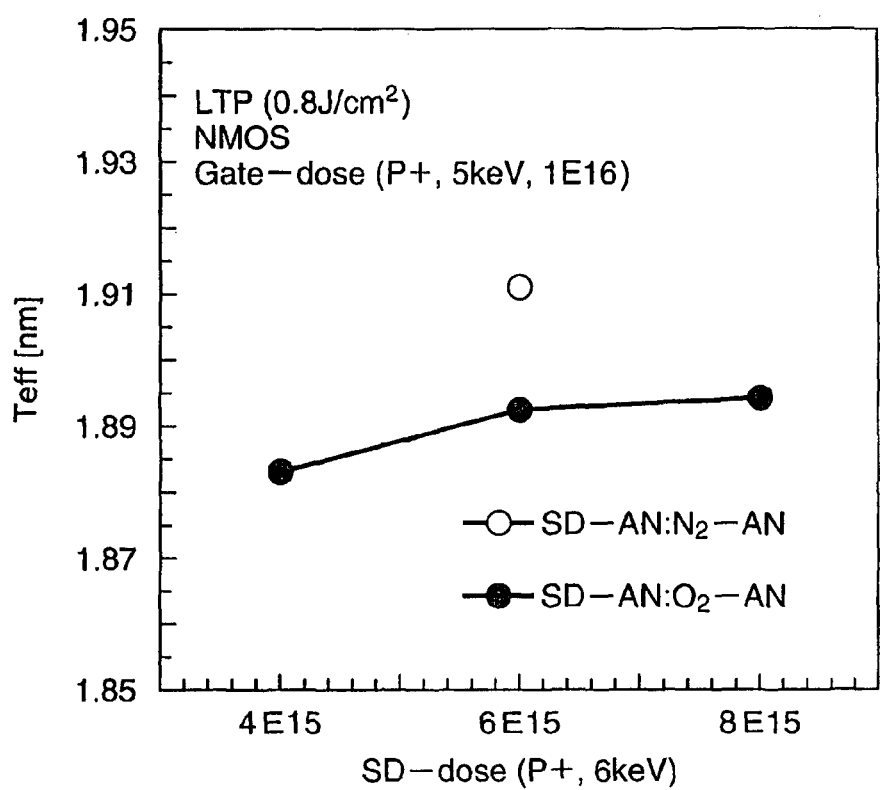
FIG. 2 is a characteristic graph representing effective gate-insulating-film thickness (Teff) in a gate electrode, in the case where lamp annealing processing was implemented while source/drain regions were formed.

FIG. 2 is a characteristic graph representing effective gate-insulating-film thickness (Teff) in a gate electrode, in the case where lamp annealing processing was implemented while source/drain regions were formed; In FIG. 2, the abscissa indicates an amount of doped impurities in source/drain regions; the mark "○" in FIG. 2 indicates a property value of a semiconductor device, in the case where lamp annealing was conventionally implemented in the presence of nitrogen;

and the mark "●" in FIG. 2 indicates a property value of a semiconductor device, in the case where lamp annealing was implemented in the presence of oxygen of 500 ppm at atmospheric pressure.

When the amount of doped impurities is 6E15, comparison of property indicates that a semiconductor device treated by conventional lamp annealing has the effective gate-insulating-film thickness of 1.91 nm and that a semiconductor device treated by lamp annealing in the presence of oxygen of 500 ppm at atmospheric pressure has the effective gate-insulating-film thickness of 1.89 nm. In this situation, the effective gate-insulating film of a semiconductor device in which impurity diffusion was implemented through laser annealing is characterized by having approximately the same thickness as that of the semiconductor device treated by lamp annealing in the presence of oxygen of 500 ppm at atmospheric pressure. It was found that, in the case of conventional lamp annealing processing, impurities in the gate electrode 103 diffuse outward, thereby thickening the effective gate-insulating film, and that, in contrast, in the case of the lamp annealing processing in the presence of oxygen, the outward diffusion of impurities in the gate electrode 103 is suppressed, whereby the actual amount of impurities is not decreased.

Meanwhile, the increase of parasitic resistance in source/drain regions is a problem caused by reduction of ion-implantation dose in the extension region, for the purpose of suppressing the short channel effect. In other words, the problem is caused because the reduction of ion-implantation dose results in increased resistance of the extension region.

Figure 3:
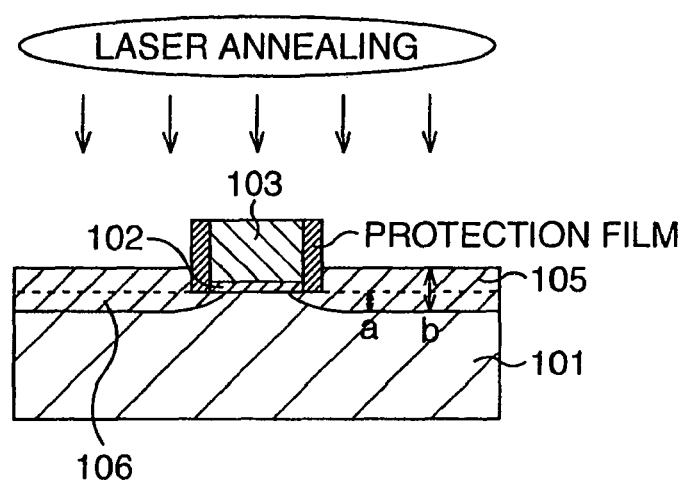
FIG. 3 is a schematic cross-sectional view of a semiconductor device, for explaining the fundamental outline of the present invention.

In order to address the problem, the inventor has devised a semiconductor device illustrated FIG. 3, in order to realize objects, which have conventionally been contradictory to each other, i.e., suppression of the increase of parasitic resistance in the source/drain regions and suppression of the short channel effect. The semiconductor device includes the gate electrode 103 patterned and formed on the semiconductor substrate 101 through the gate insulating film 102, a pair of semiconductor layers 105 formed on the semiconductor substrate 101 on both sides of the gate electrode 103, source/drain regions 106 that are formed due to penetration of impurities, under the gate electrode 103, caused by applying laser annealing to the semiconductor layers 105 in which impurities are ion-implanted. The portion indicated by "a" in FIG. 3 is an extension region; and by "b", source/drain regions.

As far as the source/drain regions 106 is concerned, by adjusting the intensity of laser beam irradiation for laser annealing, not only deep source/drain regions b can be formed, but also a shallow extension region a can effectively be formed. Moreover, the formation of these regions can be implemented through one-time laser annealing. Furthermore, the laser annealing processing for the gate electrode 103, illustrated in FIG. 1A, can be covered by the laser annealing processing for forming the source/drain regions 106; in this case, an effect is obtained in which the number of processes can be reduced.

Specific Embodiments to Which the Outline of the Present Invention is Applied

Next, various embodiments based on the fundamental outline of a semiconductor device and a manufacturing method thereof of the present invention will be described. The present embodiments will be explained with examples in which a CMOS-type transistor is employed as the semiconductor device.

Embodiment 1

FIGS. 4A through 7 are schematic cross-sectional views illustrating in order of process the method of manufacturing a CMOS-type transistor according to Embodiment 1.

Figure 4A:
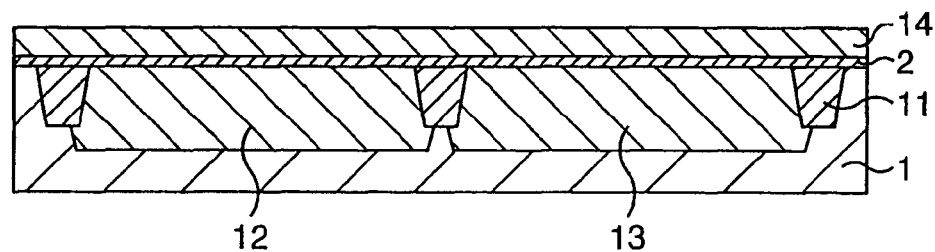
FIGS. 4A through 4D are schematic cross-sectional views illustrating in order of process the method of manufacturing a CMOS-type transistor according to Embodiment 1.

In the first place, as illustrated in FIG. 4A, the formation of a device separation structure 11 (such as a field oxide film through LOCOS method and an in-groove insulating film through STI method) that defines a device active region in a semiconductor substrate 1 made of a single crystalline silicon is implemented, and the formation of a N-type well 12 and a P-type well 13, through impurity ion implantation, is implemented. Subsequently, the gate insulating film 2 is formed on the device active region in the semiconductor substrate 1. The gate insulating film 2 is a film made of one out of a silicon oxide film, a silicon nitride film, and a silicon oxynitride film, and a metal-oxide film whose dielectric constant is higher than that of a silicon oxide film, or a stack-structure film including these materials. Subsequently, an amorphous silicon film (or an amorphous silicon germanium film) 14 is piled up on the gate insulating film 2 through the CVD method at deposition temperature of about 530° C.

Figure 4B:
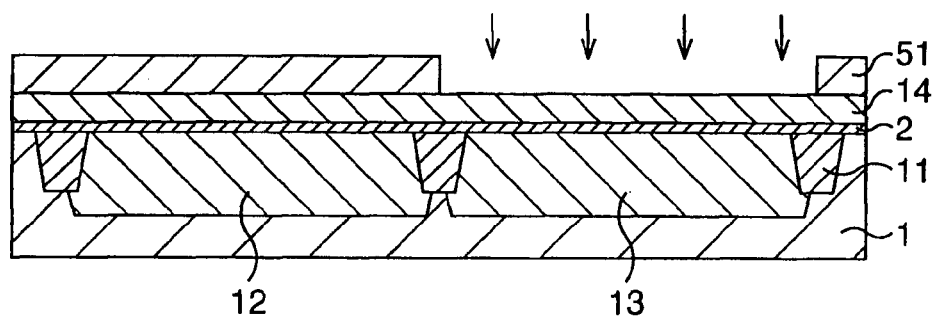

Subsequently, as illustrated in FIG. 4B, through photolithography, a photoresist pattern 51 for opening a NMOS-transistor forming region is formed on the amorphous silicon film 14, and then, for example, phosphorus (P) is ion-implanted into the amorphous silicon film 14 under the conditions of energy of 5 keV, an implantation angle of 0°, and implantation dose of $1.0 \times 10^{16}$ cm$^{-2}$. Thereafter, the photoresist pattern 51 is removed through ashing processing utilizing $O_2$ plasma, or the like.

Figure 4C:
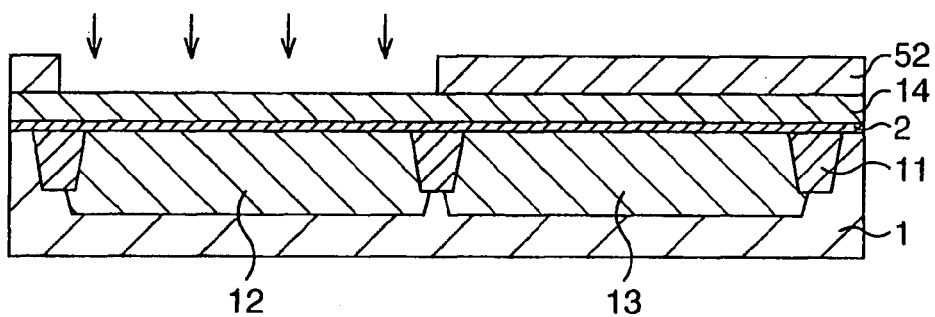

Subsequently, as illustrated in FIG. 4C, through photolithography, a photoresist pattern 52 for opening a PMOS-transistor forming region is formed on the amorphous silicon film 14, and then, for example, boron (B) is ion-implanted into the amorphous silicon film 14, under the conditions of energy of 2.5 keV, an implantation angle of 0°, and implantation dose of $1.0 \times 10^{16}$ cm$^{-2}$. Thereafter, the photoresist pattern 52 is removed through ashing processing utilizing $O_2$ plasma, or the like.

Figure 4D:
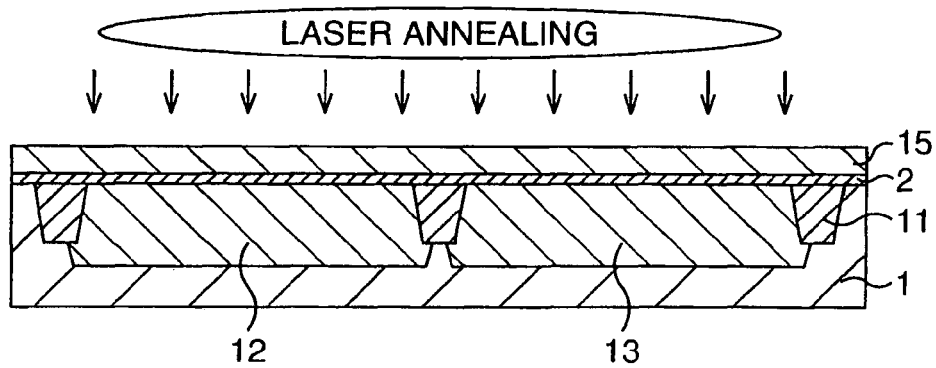

Subsequently, as illustrated in FIG. 4D, by irradiating XeCl laser having a wavelength of 308 nm, under the conditions of fusing the entire amorphous silicon film 14, e.g., under the irradiation conditions of energy of 0.8 J·cm$^{-2}$, impurities are made to diffuse throughout the amorphous silicon film 14 that is to become a gate electrode. In this situation, the amorphous silicon film 14 is crystallized to be a polysilicon film 15. Here, the polysilicon film 15 in the interface with the gate insulating film 2 has been impurity-diffused.

Figure 5A:
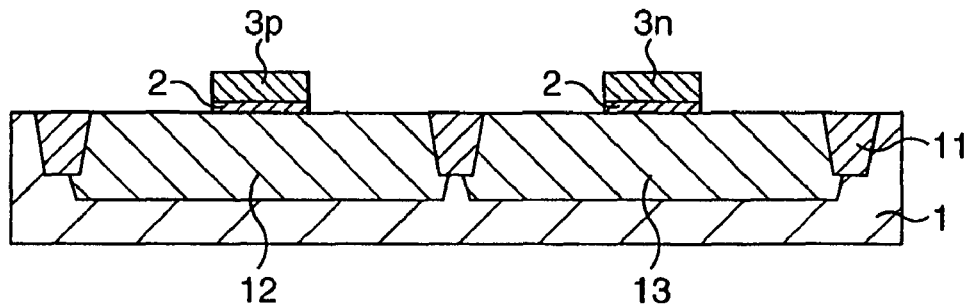
FIGS. 5A through 5D, following

Subsequently, as illustrated in FIG. 5A, by patternizing the polysilicon film 15 and the gate insulating film 2 through photolithography followed by dry etching, gate electrodes 3p and 3n (and the gate insulating film 2 processed in a shape similar thereto) are formed. The gate electrodes 3p and 3n according to Embodiment 1 are formed in such a way as to have a gate length of about 40 nm and a gate height of about 100 nm.

Figure 5B:
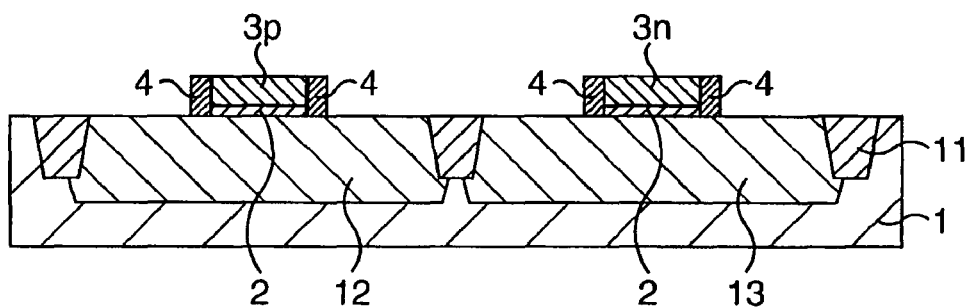

Subsequently, sidewalls 4, illustrated FIG. 5B, that are supposed to become offset spacers are formed.

Specifically, after piling up through the CVD method a silicon oxide film up to about 10 nm over the entire surface, anisotropic etching (etch-back) is applied to the entire surface of the silicon oxide film; in consequence, the silicon oxide film is left merely on surfaces on both sides of the gate electrodes 3p and 3n, thereby forming thin sidewalls 4.

Figure 5C:
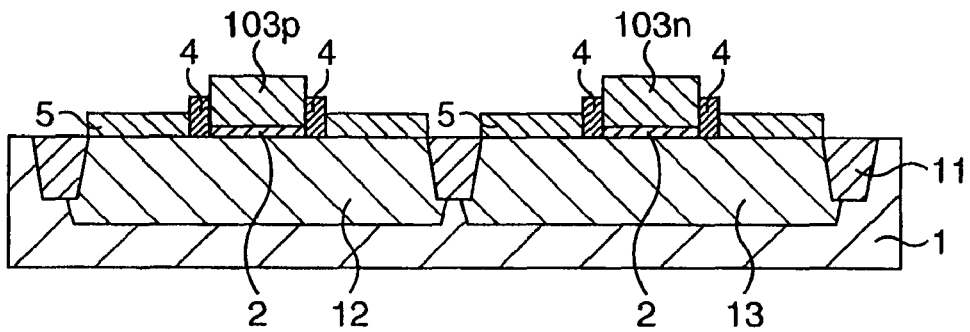

Next, as illustrated in FIG. 5C, a pair of semiconductor layers for a source forming region and a drain forming region is formed on the semiconductor substrate 1.

Specifically, through the epitaxial growth method, epitaxial silicon layers (or silicon germanium layers) 5 having a film thickness of about 20 nm are formed on the source forming region and the drain forming region of the semiconductor substrate 1. In this situation, with a CVD apparatus being supplied with dichlorosilane ($SiHCl_2$) as raw gas, the epitaxial silicon layer is deposited under the conditions of temperature of about 700° C. and time period of about 10 minutes. In Embodiment 1, an example is shown in which the epitaxial silicon layers 5 are formed also on the top surfaces of the gate electrodes 3p and 3n; however, the epitaxial silicon layers 5 are not necessarily required to be formed on the top surfaces of the gate electrodes 3p and 3n. Meanwhile, hereinafter, the gate electrode 3p in which the epitaxial silicon layer 5 is formed is referred to as a gate electrode 103p, and the gate electrode 3n in which the epitaxial silicon layer 5 is formed is referred to as a gate electrode 103n.

Figure 5D:
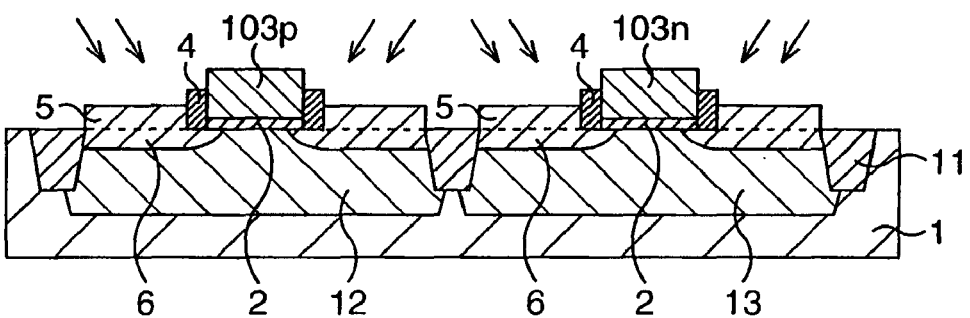

Subsequently, amorphous regions 6 illustrated in FIG. 5D are formed. The amorphous region 6 is formed through ion implantation utilizing heavy atoms.

Specifically, atoms having nature to the extent of being enough to amorphize the single crystalline silicon into amorphous silicon are ion-implanted into the epitaxial silicon layer 5 from oblique directions, indicated by arrows in FIG. 5D, with respect to the surface of the epitaxial silicon layer 5. In Embodiment 1, by ion-implanting high-mass germanium as the atom, under the conditions of energy of 20 keV, an implantation angle of 15°, and implantation dose of $2.0 \times 10^{14}$ $cm^{-2}$, the amorphous region 6 that has a depth of about 30 nm and is made of amorphous silicon is formed. In this situation, the amorphous regions 6 undergo processing in later processes to become source/drain regions.

Subsequently, source/drain regions having an extension region are formed.

Figure 6A:
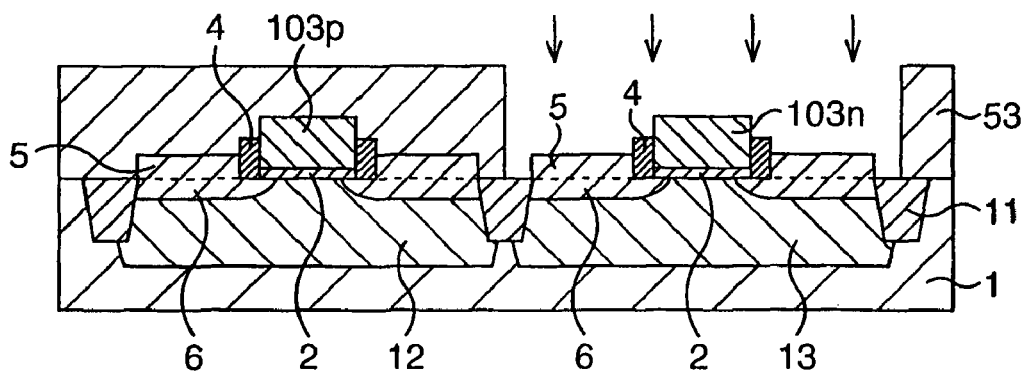
FIGS. 6A through 6D, following

Specifically, as illustrated in FIG. 6A, through photolithography, a photoresist pattern 53 for opening a NMOS-transistor forming region is formed, and then, for example, arsenic (As) is ion-implanted into the amorphous region 6 made of amorphous silicon, under the conditions of energy of 1 keV, an implantation angle of 0°, and implantation dose of $1.0 \times 10^{16}$ $cm^{-2}$. Thereafter, the photoresist pattern 53 is removed through ashing processing utilizing $O_2$ plasma, or the like.

Figure 6B:
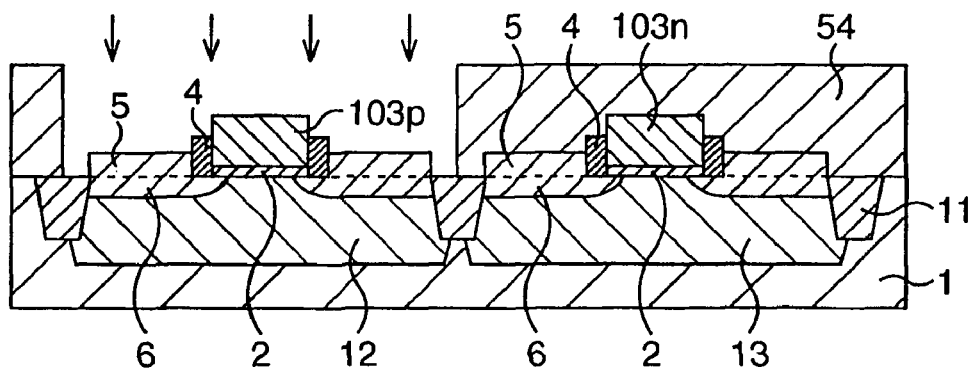

Subsequently, as illustrated in FIG. 6B, through photolithography, a photoresist pattern 54 for opening a PMOS-transistor forming region is formed, and then, for example, boron (B) is ion-implanted into the amorphous region 6 made of amorphous silicon, under the conditions of energy of 0.5 keV, an implantation angle of 0°, and implantation dose of $1.0 \times 10^{16}$ $cm^{-2}$. Thereafter, the photoresist pattern 54 is removed through ashing processing utilizing $O_2$ plasma, or the like.

Figure 6C:
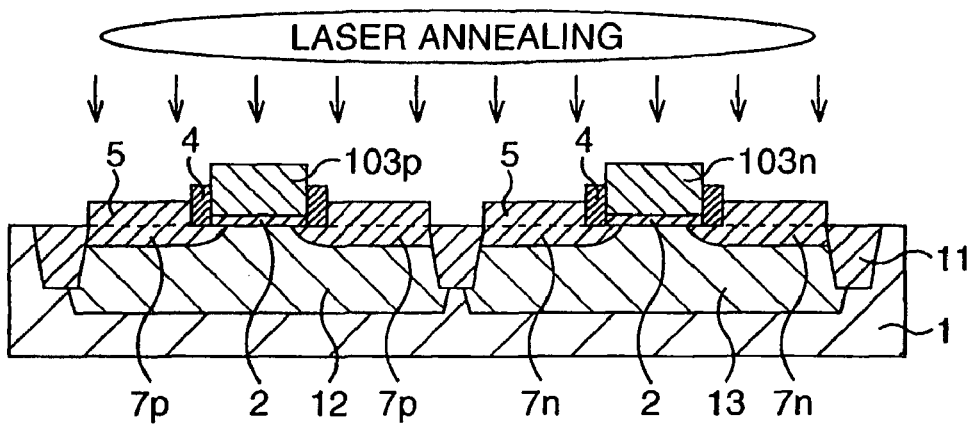

Subsequently, as illustrated in FIG. 6C, by fusing amorphous silicon in the amorphous region 6, while utilizing YAG laser having a wavelength of 532 nm, and by irradiating the YAG laser on other single crystalline silicon, under the irradiation conditions to the extent of not fusing, e.g., under the conditions of energy of 0.3 $J \cdot cm^{-2}$, the ion-implanted impurities are activated so that source/drain regions (7p and 7n) corresponding to the amorphous region 6 are formed.

Subsequently, silicide (salicide) is formed.

Figure 6D:
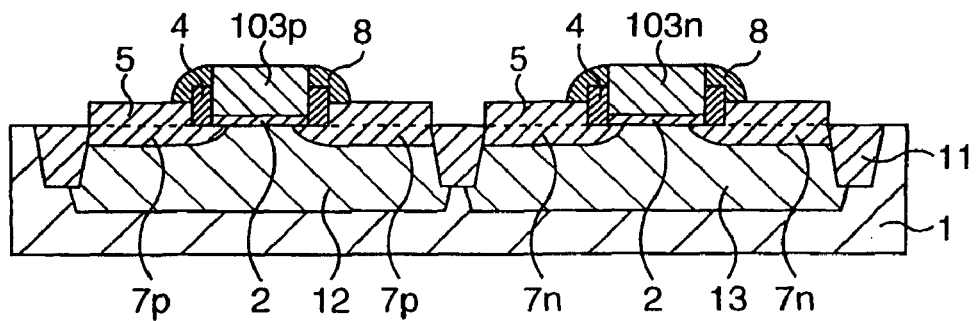

Specifically, in the first place, as illustrated in FIG. 6D, after piling up through the CVD method a silicon oxide film up to about 80 nm over the entire surface, anisotropic etching (etch-back) is applied to the entire surface of the silicon oxide film; in consequence, the silicon oxide film is left merely on surfaces on both sides of the gate electrodes 103p and 103n, thereby forming sidewalls 8.

Figure 7:
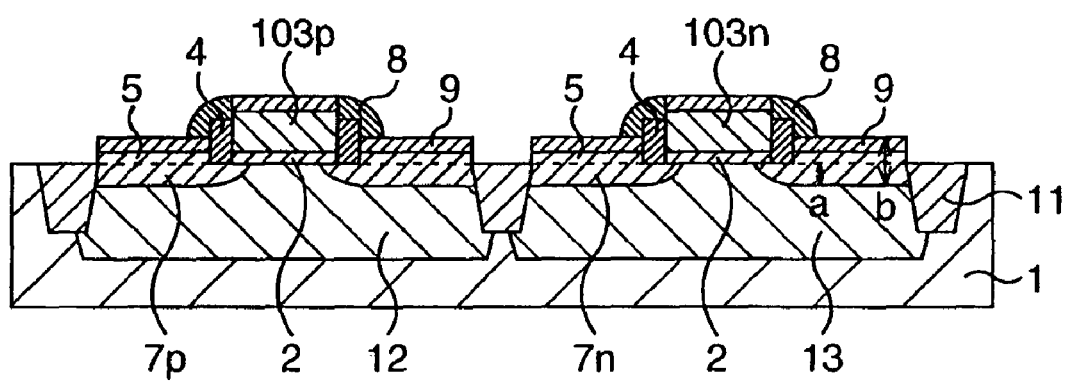
FIG. 7, following

Subsequently, as illustrated in FIG. 7, nickel (or cobalt) that is metal having a high melting point is piled up through the sputtering method; thereafter, by implementing heat treatment to perform silicidation reaction, and by removing unreacted nickel, for example, with carbon tetrafluoride ($CF_4$), silicide layers 9 are formed on the source/drain regions (7p and 7n) and the gate electrodes 103p and 103n. The formed silicide layer 9 is about 15 nm in film thickness.

Then, after processes for forming interlayer insulating films, contact holes, various types of wiring, and the like, the semiconductor device according to Embodiment 1 is completed.

In the semiconductor device according to Embodiment 1, the region "a" illustrated in FIG. 7 corresponds to the extension region in which the density of impurities is low, and the region "b" corresponds to the a source/drain region in the depth direction. In this situation, the formed extension region a is shallow with depth of about 10 nm, and the source/drain region b is sufficiently deep with depth of about 30 nm; therefore, the problem of leakage after silicidation does not occur. In addition, the difference between the source/drain region b and the extension region a corresponds to the film thickness (about 20 nm) of the epitaxial silicon layer 5 formed through epitaxial growth.

In Embodiment 1, the formation of the amorphous regions 6 through ion-implantation of germanium is implemented before the ion-implantation of impurities (arsenic or boron) for the purpose of forming the source/drain regions; however, the formation of the amorphous region 6 may be implemented after the ion-implantation of impurities.

Figure 8:
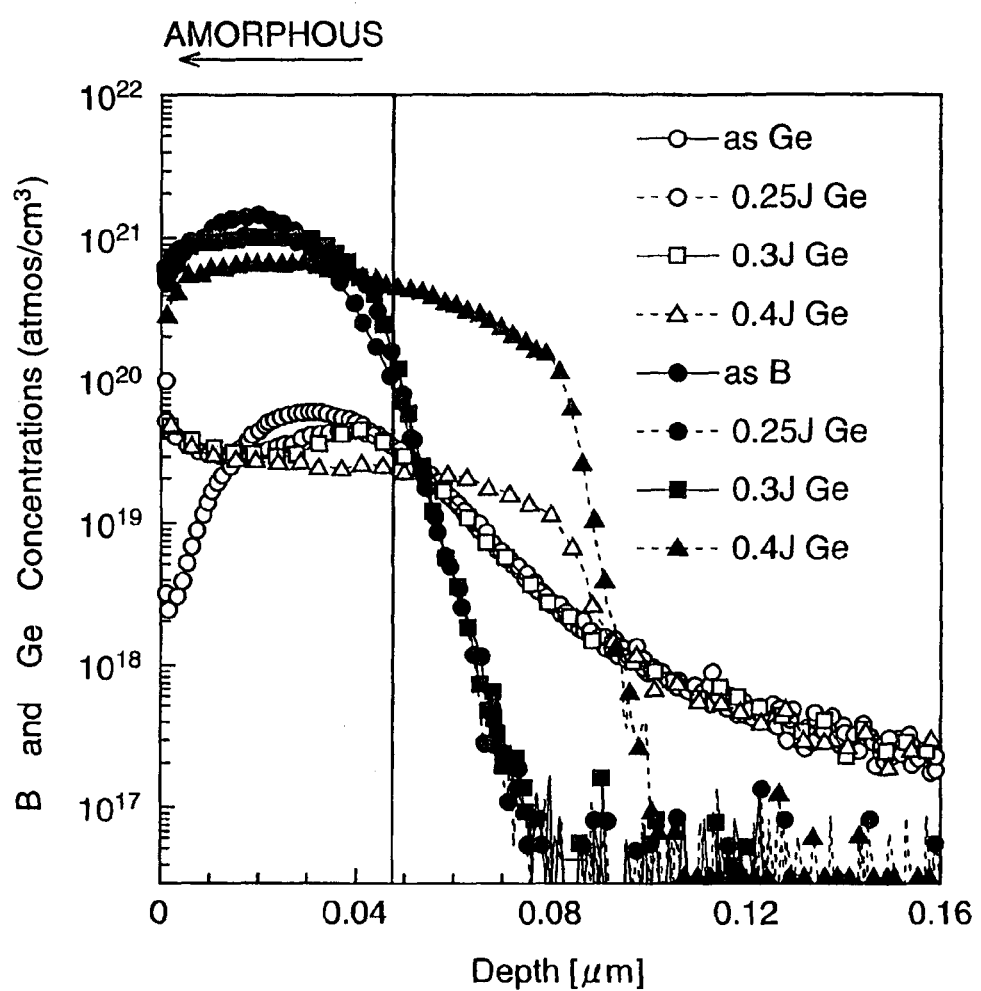
FIG. 8 is a characteristic graph representing the state of impurity diffusion in the source/drain regions of a semiconductor device according to Embodiment 1.

FIG. 8 is a characteristic graph representing the state of impurity diffusion in the source/drain regions of a semiconductor device according to Embodiment 1. From this characteristic graph, with energy of 0.25 J and 0.30 J, it can be seen that boron (B) and germanium (Ge) diffuse only in the region amorphized by germanium ion-implanted in the process in FIG. 5D. Accordingly, if the formation of the amorphous region 6, in FIG. 5D is implemented under these energy conditions, the source/drain regions (7p and 7n) corresponding to the amorphous region 6 can be formed.

According to Embodiment 1, by applying laser annealing to the amorphous silicon film 14 that is supposed to become a gate electrode, impurities ion-implanted in the silicon film are diffused up to the interface between the silicon film and the gate insulating film 2, whereby the depletion of the gate electrode can be suppressed.

Moreover, after forming the epitaxial silicon layers 5 on the source forming region and the drain forming region, in the semiconductor substrate 1 and after ion-implanting desired impurities into the silicon layers 5 by applying laser annealing, the source/drain regions (7p and 7n) is formed; therefore, the extension region a in which the intensity of impurities is low, shallow, and steep and the source/drain region b in which the intensity of impurities is sufficiently deep can be formed, whereby the parasitic resistance of the source/drain regions (7p and 7n) can be reduced, and the short channel effect can be suppressed. Furthermore, the extension region a and the source/drain region b can be formed through one-time laser annealing. Still moreover, the parasitic resistance can be reduced compared to the case where the formation is implemented through lamp annealing.

Furthermore, before or after ion-implanting impurities for forming the source/drain regions (7p and 7n), high-mass atoms such as germanium atoms are ion-implanted through the surface of the epitaxial silicon layer 5, from oblique directions; therefore, the amorphous regions 6 can be formed in such a way as to penetrate into the single crystalline silicon regions under the gate electrodes 103p and 103n. Accordingly, after ion-implanting impurities for forming the source/drain regions (7p and 7n), when laser annealing for activating the impurities is implemented, only the amorphous region 6 made of amorphous silicon is fused, while the impurities diffuse within the region, and then the region can be recrystallized; therefore, source/drains (7p and 7n) forming regions can be defined, and the formation of the steeper extension region a can be realized.

Variant Example of Method of Manufacturing Semiconductor Device, According to Embodiment 1

In a method of manufacturing a CMOS-type transistor, according to a variant example of Embodiment 1, the laser annealing process applied in FIG. 4D to the semiconductor film that is supposed to become the gate electrode is implemented concurrently with laser annealing process for forming source/drain regions.

FIGS. 9A through 11D are schematic cross-sectional views illustrating in order of process the method of manufacturing a CMOS-type transistor according to a variant example of Embodiment 1.

Figure 9A:
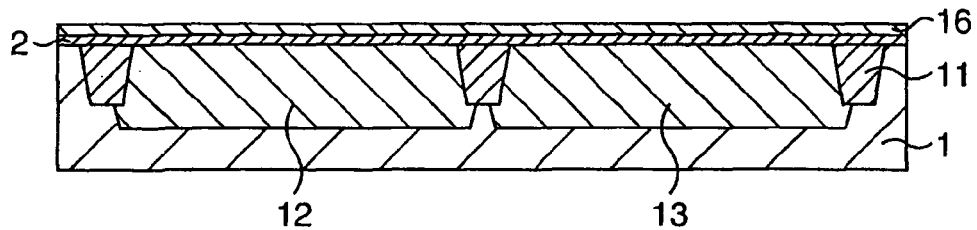
FIGS. 9A through 9D are schematic cross-sectional views illustrating in order of process the method of manufacturing a CMOS-type transistor according to a variant example of Embodiment 1.

In the first place, as illustrated in FIG. 9A, the formation of a device separation structure 11 (such as a field oxide film through LOCOS method and an in-groove insulating film through STI method) that defines a device active region in a semiconductor substrate 1 made of a single crystalline silicon is implemented, and the formation of a N-type well 12 and a P-type well 13, through impurity ion implantation, is implemented. Subsequently, the gate insulating film 2 is formed on the device active region in the semiconductor substrate 1. The gate insulating film 2 is a film made of one out of a silicon oxide film, a silicon nitride film, and a silicon oxynitride film, and a metal-oxide film whose dielectric constant is higher than that of a silicon oxide film, or a stack-structure film including these materials. Subsequently, a polysilicon film (or a polysilicon germanium film) 16 is piled up on the gate insulating film 2, through the CVD method.

Figure 9B:
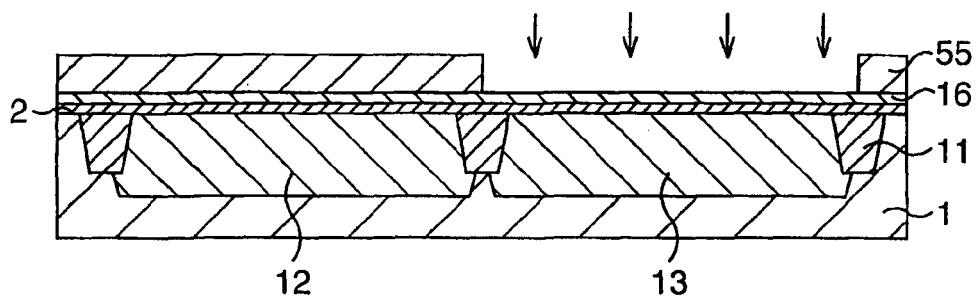

Subsequently, as illustrated in FIG. 9B, through photolithography, a photoresist pattern 55 for opening a NMOS-transistor forming region is formed on the polysilicon film 16, and then, for example, phosphorus (P) is ion-implanted into the polysilicon film 16 under the conditions of energy of 1 keV, an implantation angle of 0°, and implantation dose of $1.0 \times 10^{16}$ cm$^{-2}$. Thereafter, the photoresist pattern 55 is removed through ashing processing utilizing $O_2$ plasma, or the like.

Figure 9C:
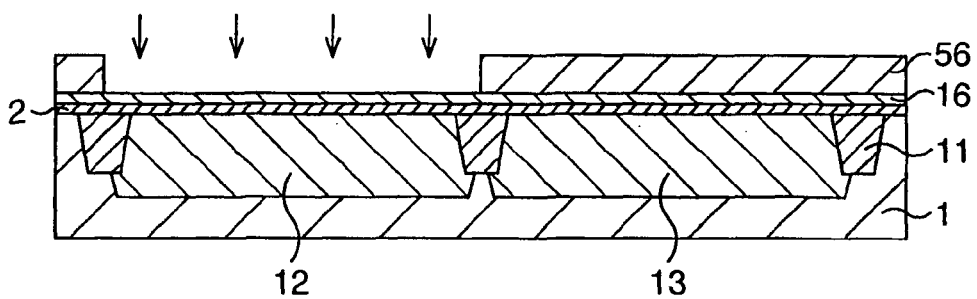

Subsequently, as illustrated in FIG. 9C, through photolithography, a photoresist pattern 56 for opening a PMOS-transistor forming region is formed on the polysilicon film 16, and then, for example, boron (B) is ion-implanted into the polysilicon film 16, under the conditions of energy of 0.5 keV, an implantation angle of 0°, and implantation dose of $1.0 \times 10^{16}$ cm$^{-2}$. Thereafter, the photoresist pattern 56 is removed through ashing processing utilizing $O_2$ plasma, or the like.

Figure 9D:
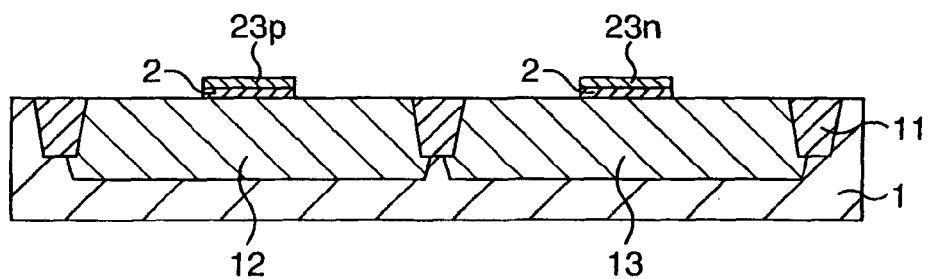

Subsequently, as illustrated in FIG. 9D, by patternizing the polysilicon film 16 and the gate insulating film 2 through photolithography followed by dry etching, gate electrodes 23p and 23n (and the gate insulating film 2 processed in a shape similar thereto) are formed. The gate electrodes 23p and 23n are formed in such a way as to have a gate length of about 40 nm and a gate height of about 10 nm. In this situation, p-type impurities have been doped into the gate electrode 23p formed in a PMOS-transistor forming region, and n-type impurities have been doped into the gate electrode 23n formed in a NMOS-transistor forming region.

Figure 10A:
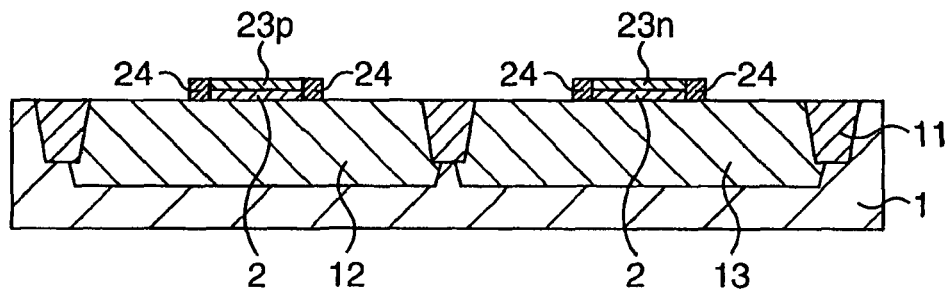
FIGS. 10A through 10D, following

Subsequently, sidewalls 24, illustrated in FIG. 10A, that are supposed to become offset spacers are formed.

Specifically, after piling up through the CVD method a silicon oxide film up to about 10 cm over the entire surface, anisotropic etching (etch-back) is applied to the entire surface of the silicon oxide film; in consequence, the silicon oxide film is left merely on surfaces on both sides of the gate electrodes 23p and 23n, thereby forming thin sidewalls 24.

Figure 10B:
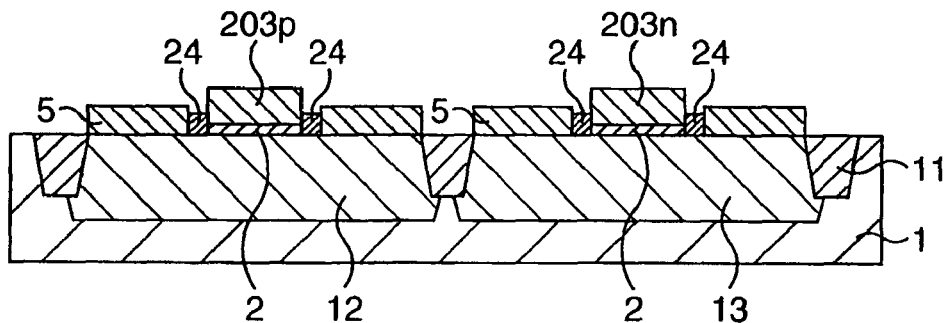

Next, as illustrated in FIG. 10B, a pair of semiconductor layers for a source forming region and a drain forming region is formed on the semiconductor substrate 1.

Specifically, through the epitaxial growth method, epitaxial silicon layers (or silicon germanium layers) 5 having a film thickness of about 20 nm are formed on the source forming region and the drain forming region of the semiconductor substrate 1. In this situation, with a CVD apparatus being supplied with dichlorosilane ($SiHCl_2$) as raw gas, the epitaxial silicon layer is deposited under the conditions of temperature of about 700° C. and time period of about 10 minutes. Moreover, also in the present variant example, an example is shown in which the epitaxial silicon layers 5 are formed also on the top surfaces of the gate electrodes 23p and 23n; however, the epitaxial silicon layers 5 are not necessarily required to be formed on the top surfaces of the gate electrodes 23p and 23n. Meanwhile, hereinafter, the gate electrode 23p in which the epitaxial silicon layer 5 is formed is referred to as a gate electrode 203p, and the gate electrode 23n in which the epitaxial silicon layer 5 is formed is referred to as a gate electrode 203n.

Figure 10C:
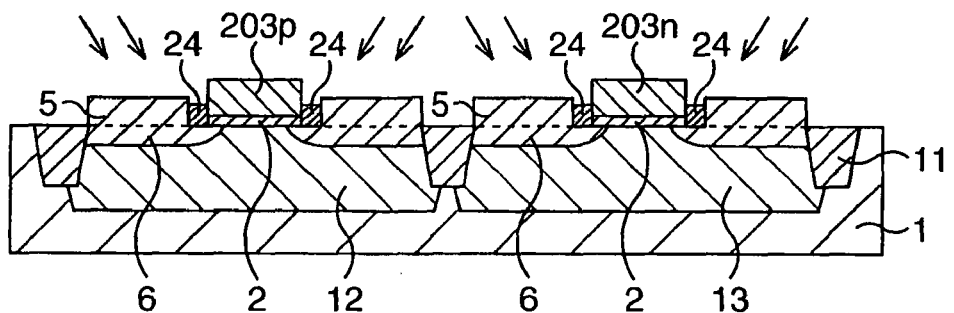

Subsequently, amorphous regions 6 illustrated in FIG. 10C are formed. The amorphous region 6 is formed through ion implantation utilizing heavy atoms.

Specifically, atoms having nature to the extent of being enough to amorphize the single crystalline silicon into amorphous silicon are ion-implanted into the epitaxial silicon layer 5 from oblique directions, indicated by arrows in FIG. 10C, with respect to the surface of the epitaxial silicon layer 5. In the present variant example, by ion-implanting high-mass germanium as the atom, under the conditions of energy of 20 keV, an implantation angle of 15°, and implantation dose of $2.0 \times 10^{14}$ cm$^{-2}$, the amorphous region 6 that has a depth of about 30 nm and is made of amorphous silicon is formed. In this situation, the amorphous regions 6 undergo processing in later processes to become source/drain regions. In this situation, crystallized silicon up to 30 nm-depth from the surfaces of the gate electrodes 203p and 203n, i.e., the entire crystallized silicon that constitutes the gate electrodes 203p and 203n is amorphized to become amorphous silicon.

Subsequently, source/drain regions having an extension region are formed.

Figure 10D:
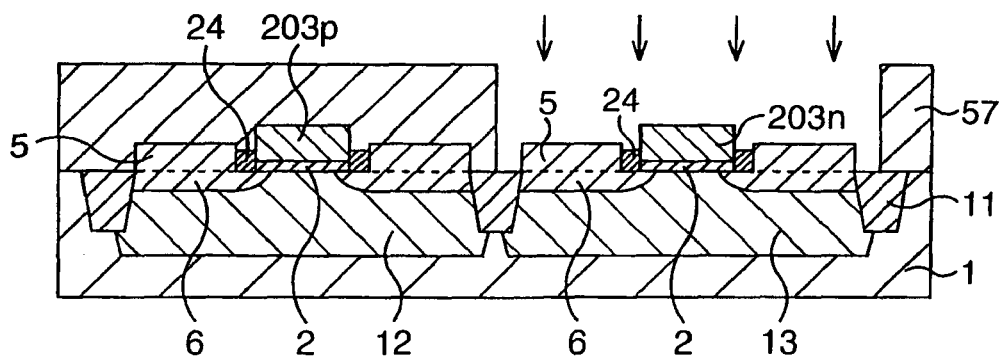

Specifically, in the first place, as illustrated in FIG. 10D, through photolithography, a photoresist pattern 57 for opening a NMOS-transistor forming region is formed, and then, for example, arsenic (As) is ion-implanted into the amorphous region 6 made of amorphous silicon, under the conditions of energy of 1 keV, an implantation angle of 0°, and implantation dose of $1.0 \times 10^{16}$ cm$^{-2}$. Thereafter, the photoresist pattern 57 is removed through ashing processing utilizing $O_2$ plasma, or the like.

Figure 11A:
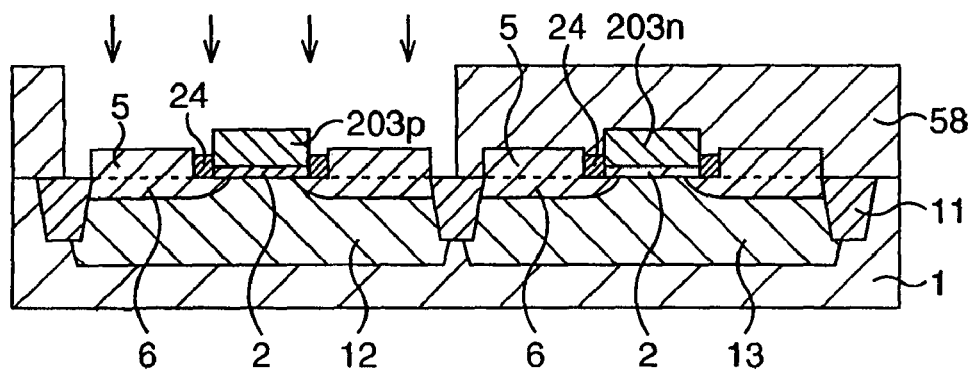
FIGS. 11A through 11D, following

Subsequently, as illustrated in FIG. 11A, through photolithography, a photoresist pattern 58 for opening a PMOS-transistor forming region is formed, and then, for example, boron (B) is ion-implanted into the amorphous region 6 made of amorphous silicon, under the conditions of energy of 0.5 keV, an implantation angle of 0°, and implantation dose of $1.0 \times 10^{16}$ cm$^{-2}$. Thereafter, the photoresist pattern 58 is removed through ashing processing utilizing $O_2$ plasma, or the like.

Figure 11B:
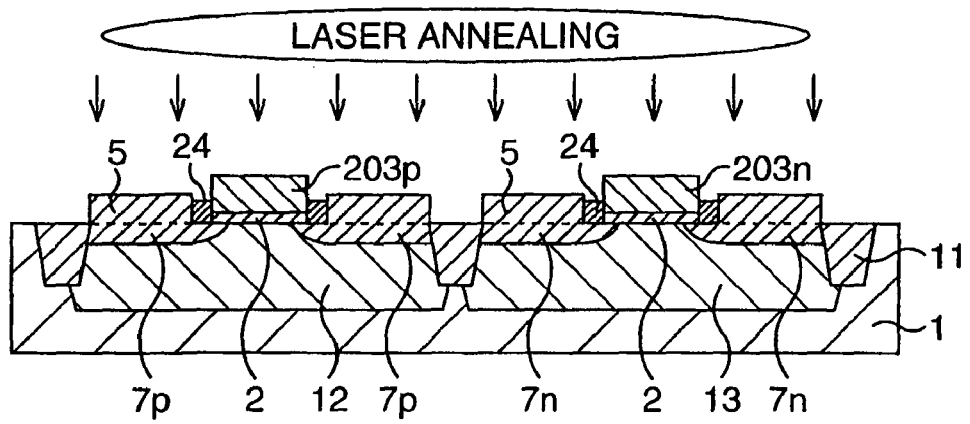

Subsequently, as illustrated in FIG. 11B, by fusing the entire amorphous silicon that constitutes the gate electrodes 203p and 203n, and amorphous silicon in the amorphous region 6, while utilizing YAG laser having a wavelength of 532 nm, by irradiating the YAG laser on other single crystalline silicon, under the irradiation conditions to the extent of not fusing other single crystalline silicon, e.g., under the conditions of energy of 0.3 J·cm$^{-2}$, thereby activating impurities ion-implanted in the gate electrodes 203$p$ and 203$n$ and activating impurities ion-implanted in the amorphous region 6, and by diffusing impurities preliminarily implanted in the entire gate electrodes 203$p$ and 203$n$ and diffusing impurities preliminarily implanted in the entire amorphous regions 6, the source/drain regions (7$p$ and 7$n$) are formed.

Subsequently, silicide (salicide) is formed.

Figure 11C:
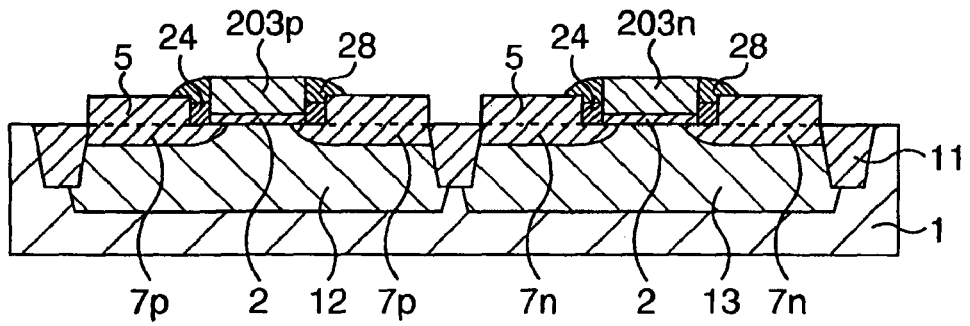

Specifically, in the first place, as illustrated in FIG. 11C, after piling up through the CVD method a silicon oxide film up to about 80 nm over the entire surface, anisotropic etching (etch-back) is applied to the entire surface of the silicon oxide film; in consequence, the silicon oxide film is left merely on surfaces on both sides of the gate electrodes 203$p$ and 203$n$, thereby forming sidewalls 28.

Figure 11D:
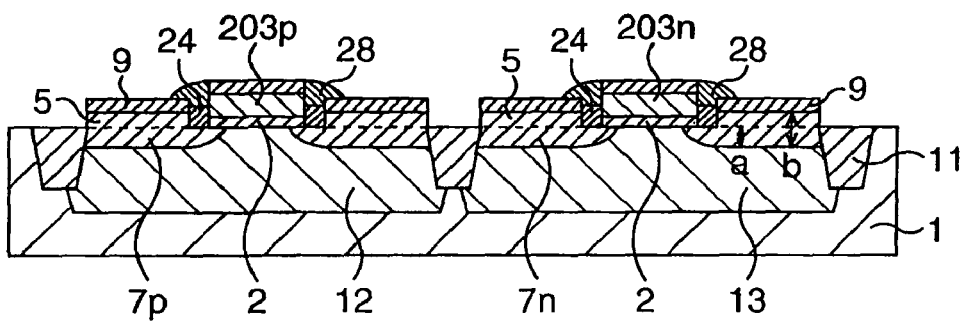

Subsequently, as illustrated in FIG. 11D, nickel (or cobalt) that is metal having a high melting point is piled up through the sputtering method; thereafter, by implementing heat treatment to cause the piled-up nickel to perform silicidation reaction, and by removing unreacted nickel, for example, with carbon tetrafluoride (CF$_4$), silicide layers 9 are formed on the source/drain regions (7$p$ and 7$n$) and the gate electrodes 203$p$ and 203$n$. The formed silicide layer 9 is about 15 nm in film thickness.

Then, after processes for forming interlayer insulation films, contact holes, various types of wiring, and the like, the semiconductor device according to the variant example of Embodiment 1 is completed.

Also in the semiconductor device according to the present variant example, the region "a" illustrated in FIG. 11D corresponds to an extension region in which the density of impurities is low, and the region "b" corresponds to a source/drain region in the depth direction. In this situation, the formed extension region a is shallow with depth of about 10 nm, and the source/drain region b is sufficiently deep with depth of about 30 nm; therefore, the problem of leakage after silicidation does not occur. In addition, the difference between the source/drain regions b and the extension region a corresponds to the film thickness (about 20 nm) of the epitaxial silicon layer 5 formed through epitaxial growth. Moreover, the initial film thickness of the gate electrode according to the present variant example is about 10 nm, and the film thickness of the epitaxial silicon layer 5 formed on the gate electrode is about 20 nm; therefore, the film thickness of the gate electrodes 203$p$ and 203$n$ is about 30 nm. Accordingly, as indicated in the present variant example, by adjusting the formation of the amorphous region 6 up to about 30 nm, the impurity active regions in the gate electrodes 203$p$ and 203$n$ can be limited up to the interface between the gate electrode and the gate insulating film 2; therefore, the activation of impurities preliminarily doped in the gate electrode can be covered by laser annealing for forming source/drain regions (7$p$ and 7$n$).

Still moreover, also in the present variant example, the formation of the amorphous region 6 through ion-implantation of germanium is implemented before the ion-implantation of impurities (arsenic or boron) for the purpose of forming the source/drain region; however, the formation of the amorphous region 6 may be implemented after the ion-implantation of impurities.

According to the present variant example, in addition to the effects of examples according to Embodiment 1, the annealing process for activating impurities preliminarily doped in the gate electrode can be covered by laser annealing process for forming source/drain regions (7$p$ and 7$n$); therefore, the number of processes can be reduced.

Embodiment 2

FIGS. 12A through 14C are schematic cross-sectional views illustrating in order of process the method of manufacturing a CMOS-type transistor according to Embodiment 2.

Figure 12A:
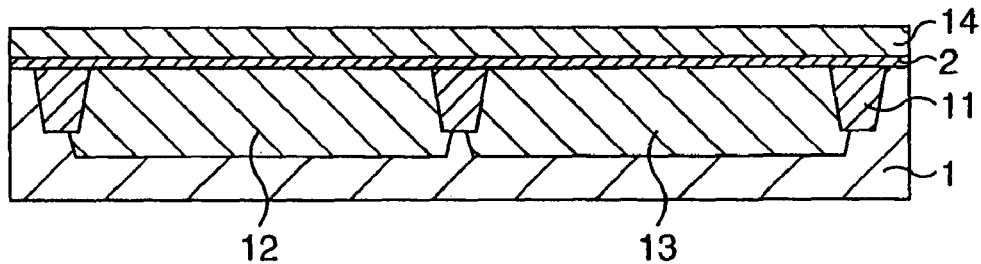
FIGS. 12A through 12D are schematic cross-sectional views illustrating in order of process the method of manufacturing a CMOS-type transistor according to Embodiment 2.

In the first place, as illustrated in FIG. 12A, the formation of a device separation structure 11 (such as a field oxide film through LOCOS method and an in-groove insulating film through STI method) that defines a device active region in a semiconductor substrate 1 made of a single crystalline silicon is implemented, and the formation of a N-type well 12 and a P-type well 13, through impurity ion implantation, is implemented. Subsequently, the gate insulating film 2 is formed on the device active region in the semiconductor substrate 1. The gate insulating film 2 is a film made of one out of a silicon oxide film, a silicon nitride film, and a silicon oxynitride film, and a metal-oxide film whose dielectric constant is higher than that of a silicon oxide film, or a stack-structure film including these materials. Subsequently, an amorphous silicon film (or an amorphous silicon germanium film) 14 is piled up on the gate insulating film 2 through the CVD method at deposition temperature of about 530° C.

Figure 12B:
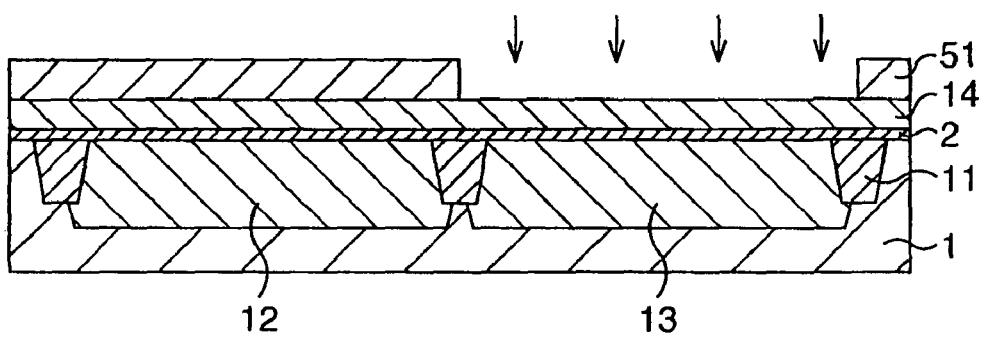

Subsequently, as illustrated in FIG. 12B, through photolithography, a photoresist pattern 51 for opening a NMOS-transistor forming region is formed on the amorphous silicon film 14, and then, for example, phosphorus (P) is ion-implanted into the amorphous silicon film 14 under the conditions of energy of 5 keV, an implantation angle of 0°, and implantation dose of $1.0 \times 10^{16}$ cm$^{-2}$. Thereafter, the photoresist pattern 51 is removed through ashing processing utilizing O$_2$ plasma, or the like.

Figure 12C:
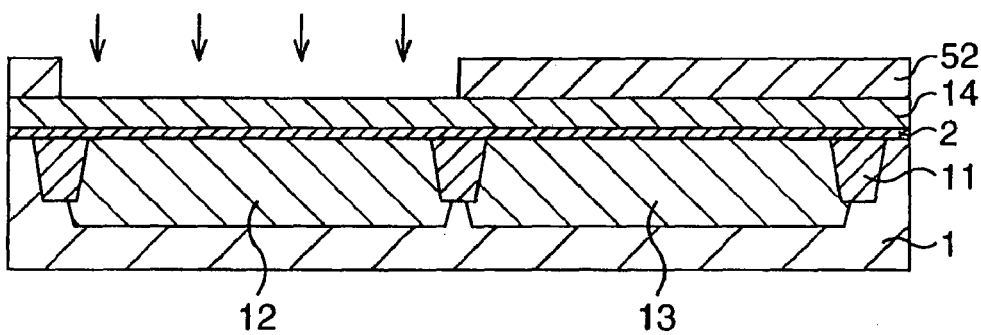

Subsequently, as illustrated in FIG. 12C, through photolithography, a photoresist pattern 52 for opening a PMOS-transistor forming region is formed on the amorphous silicon film 14, and then, for example, boron (B) is ion-implanted into the amorphous silicon film 14, under the conditions of energy of 2.5 keV, an implantation angle of 0°, and implantation dose of $1.0 \times 10^{16}$ cm$^{-2}$. Thereafter, the photoresist pattern 52 is removed through ashing processing utilizing O$_2$ plasma, or the like.

Figure 12D:
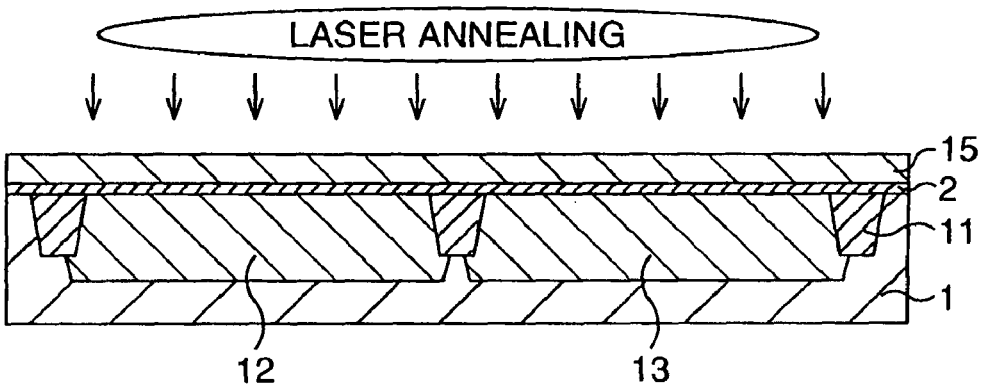

Subsequently, as illustrated in FIG. 12D, by irradiating XeCl laser having a wavelength of 308 nm, under the conditions of fusing the entire amorphous silicon film 14, e.g., under the irradiation conditions of energy of 0.8 J·cm$^{-2}$, impurities are made to diffuse throughout the amorphous silicon film 14 that is to become a gate electrode. In this situation, the amorphous silicon film 14 is crystallized to be a polysilicon film 15. Here, the polysilicon film 15 in the interface with the gate insulating film 2 has been impurity-diffused.

Figure 13A:
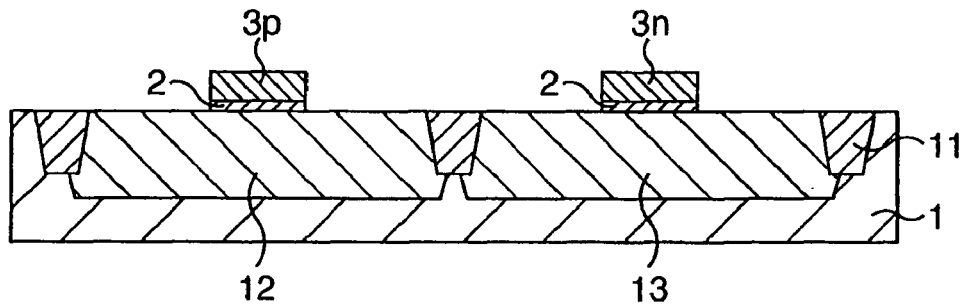
FIGS. 13A through 13D, following

Subsequently, as illustrated in FIG. 13A, by patternizing the polysilicon film 15 and the gate insulating film 2 through photolithography followed by dry etching, gate electrodes 3$p$ and 3$n$ (and the gate insulating film 2 processed in a shape similar thereto) are formed.

Subsequently, source/drain regions having an extension region are formed.

Figure 13B:
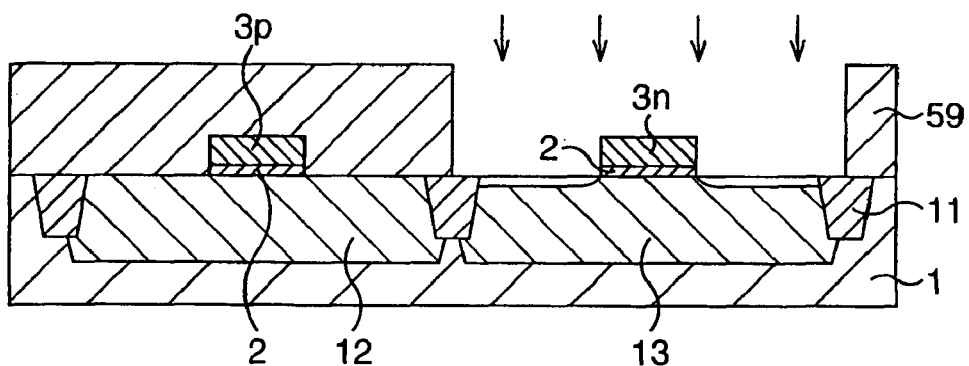

Specifically, in the first place, as illustrated in FIG. 13B, through photolithography, a photoresist pattern 59 for opening a NMOS-transistor forming region is formed, and then, for example, phosphor (P) is ion-implanted into the semiconductor substrate 1, under the conditions of energy of 1 keV, an implantation angle of 0°, and implantation dose of $1.0 \times 10^{15}$ cm$^{-2}$. Thereafter, the photoresist pattern 59 is removed through ashing processing utilizing O$_2$ plasma, or the like.

Figure 13C:
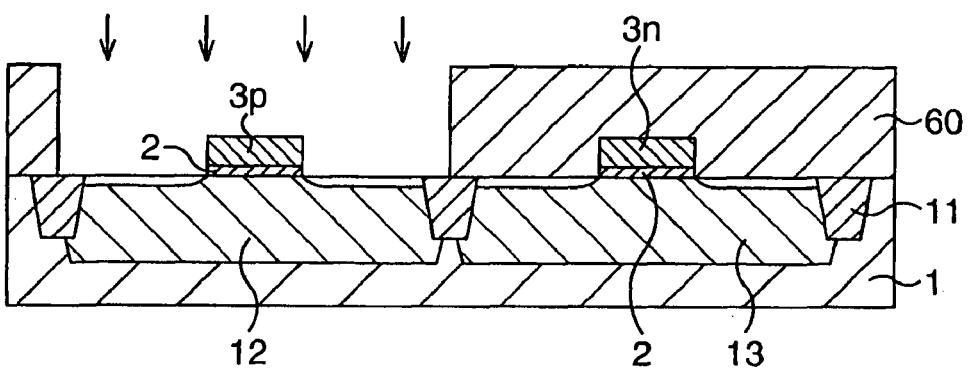

Subsequently, as illustrated in FIG. 13C, through photolithography, a photoresist pattern 60 for opening a PMOS-transistor forming region is formed, and then, for example, boron (B) is ion-implanted into the semiconductor substrate 1, under the conditions of energy of 0.3 keV, an implantation angle of 0°, and implantation dose of $1.0\times10^{15}$ cm$^{-2}$. Thereafter, the photoresist pattern 60 is removed through ashing processing utilizing $O_2$ plasma, or the like.

Figure 13D:
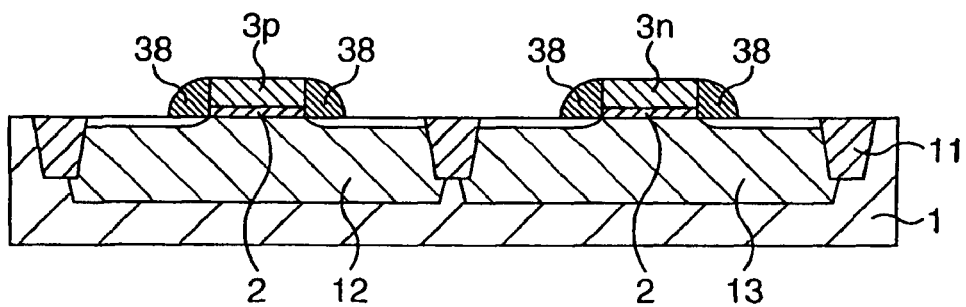

Specifically, as illustrated in FIG. 13D, after piling up through the CVD method a silicon oxide film up to about 80 nm over the entire surface, anisotropic etching (etch-back) is applied to the entire surface of the silicon oxide film; in consequence, the silicon oxide film is left merely on surfaces on both sides of the gate electrodes 3p and 3n, thereby forming sidewalls 38.

Figure 14A:
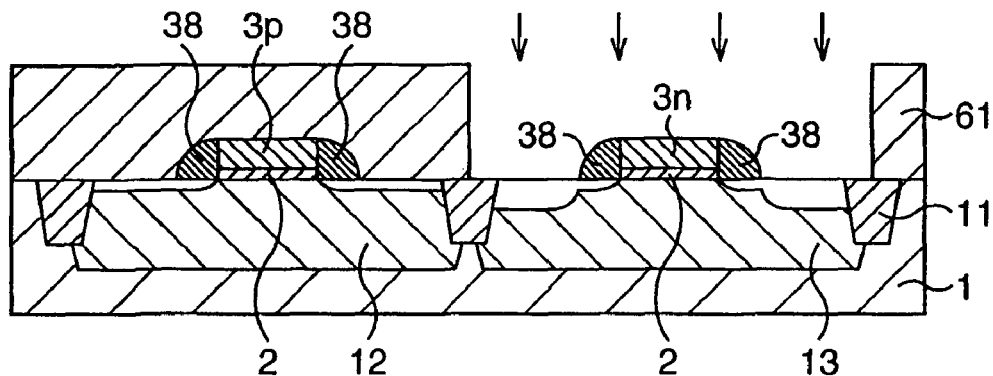
FIGS. 14A through 14C, following

Subsequently, as illustrated in FIG. 14A, through photolithography, a photoresist pattern 61 for opening a NMOS-transistor forming region is formed, and then, for example, phosphor (P) is ion-implanted into the semiconductor substrate 1, under the conditions of energy of 6 keV, an implantation angle of 0°, and implantation dose of $8.0\times10^{15}$ cm$^{-2}$. Thereafter, the photoresist pattern 61 is removed through ashing processing utilizing $O_2$ plasma, or the like.

Figure 14B:
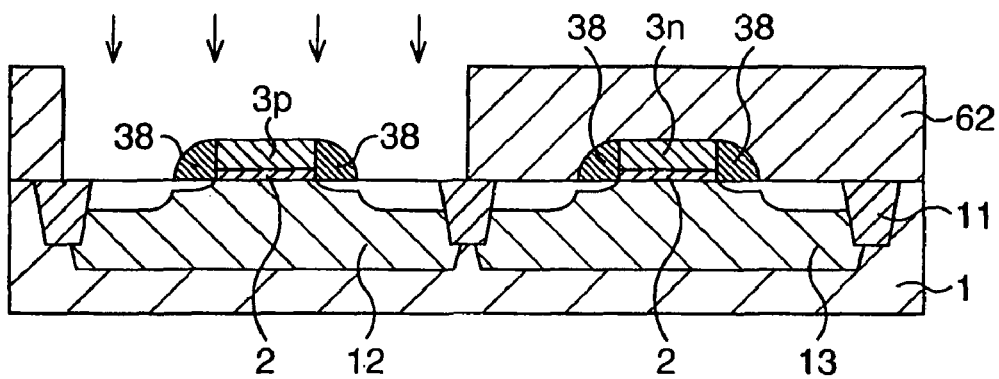

Subsequently, as illustrated in FIG. 14B, through photolithography, a photoresist pattern 62 for opening a PMOS-transistor forming region is formed, and then, for example, boron (B) is ion-implanted into the semiconductor substrate 1, under the conditions of energy of 2.5 keV, an implantation angle of 0°, and implantation dose of $4.0\times10^{15}$ cm$^{-2}$. Thereafter, the photoresist pattern 62 is removed through ashing processing utilizing $O_2$ plasma, or the like.

Figure 14C:
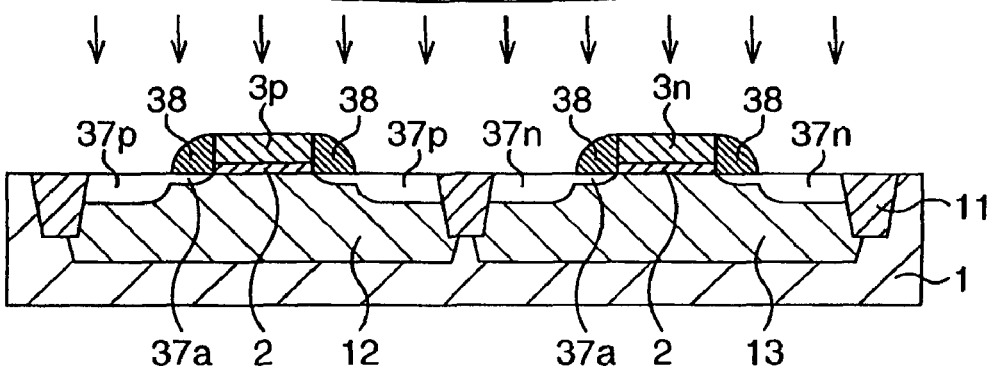

Subsequently, as illustrated in FIG. 14C, by implementing lamp annealing, in the presence of oxygen ($O_2$) of about 500 ppm at atmospheric pressure in nitrogenous ($N_2$) environment, and under the conditions of temperature from 900° C. to 1050° C. and time period from about several hundreds of milliseconds to about 3 s, source/drain regions (37p and 37n) that has an extension region 37a.

Then, by piling up high-melting-point metal, silicide (salicide) is formed; then, after processes for forming interlayer insulating films, contact holes, various wiring layers, and the like, the semiconductor device according to Embodiment 2 is completed.

In Embodiment 2, by piling up a polysilicon film instead of the amorphous silicon film 14, and by implementing amorphizing implantation (Ge$^+$, 20 keV, and 4e14), prior to the gate doping in FIGS. 12B and 12C, the polysilicon film may be amorphized Here, the properties of a semiconductor device to which lamp annealing, as the lamp annealing process in FIG. 14C, was applied in the presence of oxygen ($O_2$) at 500 ppm at atmospheric pressure, according to Embodiment 2, will be compared with those of a semiconductor device to which lamp annealing was applied conventionally in the presence of nitrogen ($N_2$)

As described above, FIG. 2 is a characteristic graph representing effective gate-insulating-film thickness (Teff) in a gate electrode, in the case where lamp annealing processing was implemented while source/drain regions were formed. In FIG. 2, the abscissa indicates an amount of doped phosphor (P) in source/drain regions of a NMOS transistor; the mark "○" in FIG. 2 indicates a property value of a semiconductor device, in the case where conventional lamp annealing was implemented; and the mark "●" in FIG. 2 indicates a property value of a semiconductor device, in the case where lamp annealing according to Embodiment 2 was implemented.

When the amount of doped phosphor (P) is 6E15, comparison of property indicates that a semiconductor device treated by conventional lamp annealing has the effective gate-insulating-film thickness of 1.91 nm and that a semiconductor device treated by lamp annealing in the presence of oxygen of 500 ppm at atmospheric pressure has the effective gate-insulating-film thickness of 1.89 nm. In this situation, the effective gate-insulating film of a semiconductor device in which impurities (P) diffusion was implemented through laser annealing is characterized by having approximately the same thickness as that of the semiconductor device treated by lamp annealing in the presence of oxygen of 500 ppm at atmospheric pressure. It is found that, in the case of conventional lamp annealing processing, phosphor (P) in the gate electrodes 3p and 3n diffuse outward, thereby thickening the effective gate-insulating film, and that, in contrast, in the case of the lamp annealing processing in the presence of oxygen, the outward diffusion of phosphor (P) in the gate electrode is suppressed, whereby the actual amount of phosphor (P) is not decreased.

Figure 15:
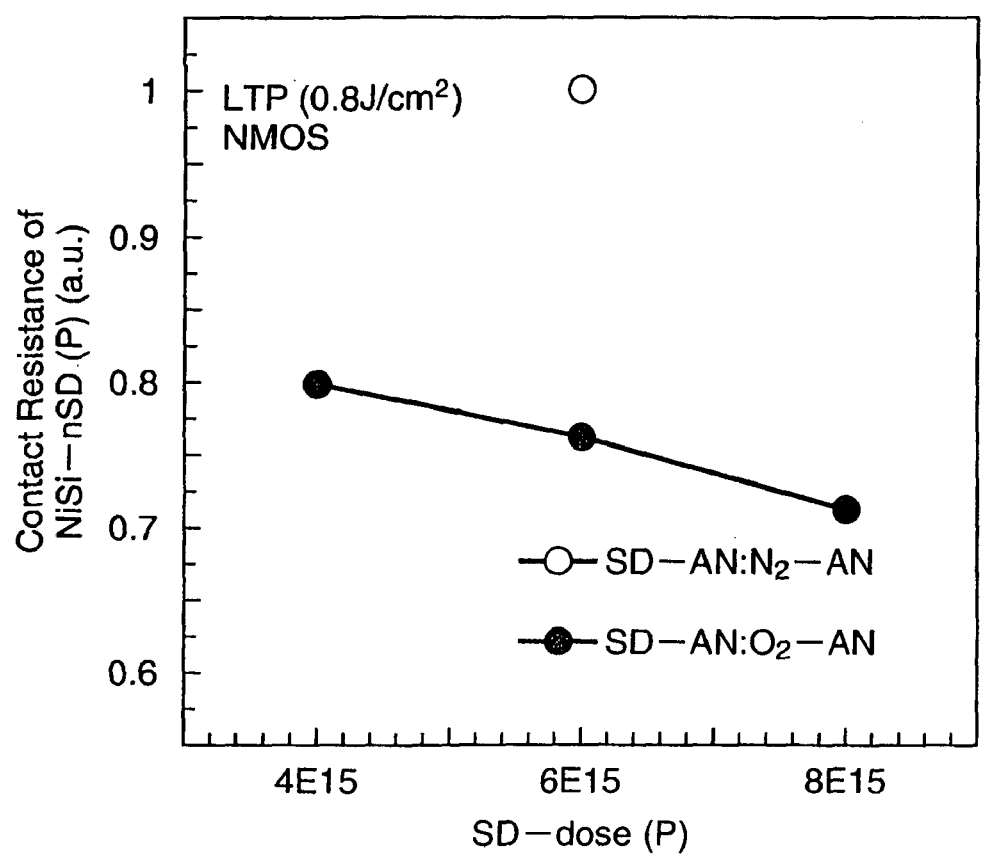
FIG. 15 is a characteristic graph representing contact resistance between source/drain regions and silicide.

FIG. 15 is a characteristic graph representing contact resistance between source/drain regions and silicide. In FIG. 15, the abscissa indicates an amount of doped phosphor (P) in a source/drain region of a NMOS transistor; the mark "○" in FIG. 2 indicates a property value of a semiconductor device, in the case where conventional lamp annealing was implemented in source/drain regions; and the mark "●" in FIG. 2 indicates a property value of a semiconductor device, in the case where lamp annealing according to Embodiment 2 was implemented. In the case of a semiconductor device to which lamp annealing processing according to Embodiment 2 is applied, the outward diffusion of phosphor (P) in the source/drain regions as well as in the gate electrode is suppressed; therefore, it is when the lamp annealing processing is implemented in the presence of oxygen that the contact resistance can be reduced.

According to Embodiment 2, because, in forming source/drain regions, the activation of impurities is implemented through lamp annealing in the presence of oxygen ($O_2$), it is possible to prevent the impurities that have been diffused up to the interface between the amorphous silicon film 14 and the gate insulating film 2, by applying laser annealing to the an amorphous silicon film 14 that is supposed to become a gate electrode, from being diffused outward; therefore, the depletion of the gate electrode can be suppressed.

INDUSTRIAL APPLICABILITY

According to the present invention, it is possible to prevent the impurities that have been diffused up to the interface between a semiconductor film that is supposed to become a gate electrode and the gate insulating film 2 from being diffused outward; therefore, the depletion of the gate electrode can be suppressed.

Moreover, according to the present invention, an extension region in which the intensity of impurities is low, shallow, and steep, and a source/drain region in which the intensity of impurities is sufficiently deep can be formed, whereby the parasitic resistance of the source/drain region can be reduced, and the short channel effect can be suppressed.

What is claimed is:

1. A method of manufacturing a semiconductor device, comprising:
    forming on a semiconductor substrate a gate insulating film; forming on the gate insulating film a semiconductor film;
    introducing impurities into the semiconductor film; and diffusing the impurities up to the interface between the semiconductor film and the gate insulating film, by irradiating a laser beam onto the semiconductor film;

after irradiating of the laser beam, patterning the semiconductor film to form a gate electrode:

forming source/drain regions, by introducing impurities into the semiconductor substrate using the gate electrode as a mask, and by diffusing through lamp annealing the impurities; and wherein the lamp annealing is implemented in the presence of oxygen in the atmosphere.

2. The method of manufacturing a semiconductor device according to claim 1, wherein introducing the impurities into the semiconductor film and diffusing the impurities up to the interface between the semiconductor film and the gate insulating film are performed before the semiconductor film is processed to have a shape of the gate electrode.

3. A method of manufacturing a semiconductor device, comprising:

forming a gate insulating film on a semiconductor substrate and forming a semiconductor film on the gate insulating film;

introducing impurities into the semiconductor film;

diffusing the impurities up to the interface between the semiconductor film and the gate insulating film, by irradiating a laser beam onto the semiconductor film;

after irradiating of the laser beam, patterning the semiconductor film to form a gate electrode;

forming a pair of semiconductor layers having a surface higher than a surface of the semiconductor substrate only on both sides of the gate electrode on the semiconductor substrate;

introducing impurities into the pair of semiconductor layers; and forming source/drain regions, by irradiating a laser beam onto the pair of semiconductor layers, and by diffusing the impurities that have been introduced into the pair of semiconductor layers, to penetrate under the gate electrode in the semiconductor substrate.

4. The method of manufacturing a semiconductor device according to claim 3, wherein the semiconductor substrate and the semiconductor layers are formed of a single crystalline semiconductor; and the method further comprising amorphizing preliminarily the single crystalline semiconductor in source/drain forming regions into an amorphous semiconductor, by introducing into the surface of the semiconductor layers, in directions oblique to the surface, atoms having nature to the extent of being enough to amorphize the single crystalline semiconductor, before or after introducing impurities into the surfaces of the semiconductor layers.

* * * * *